US012575463B2

(12) United States Patent
Kim

(10) Patent No.: US 12,575,463 B2
(45) Date of Patent: Mar. 10, 2026

(54) SEMICONDUCTOR DEVICE COMPRISING A SOLDER SUPPORT TO PREVENT DEFORMATION DURING BONDING

(71) Applicant: SAMSUNG ELECTRONICS CO., LTD., Suwon-si (KR)

(72) Inventor: Soonbum Kim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 597 days.

(21) Appl. No.: 17/679,444

(22) Filed: Feb. 24, 2022

(65) Prior Publication Data

US 2022/0399296 A1 Dec. 15, 2022

(30) Foreign Application Priority Data

Jun. 15, 2021 (KR) ......................... 10-2021-0077601

(51) Int. Cl.
*H01L 23/00* (2006.01)
*H01L 23/498* (2006.01)
*H01L 25/065* (2023.01)

(52) U.S. Cl.
CPC ........ *H01L 24/08* (2013.01); *H01L 23/49811* (2013.01); *H01L 24/05* (2013.01); *H01L 24/10* (2013.01); *H01L 24/80* (2013.01); *H01L 25/0655* (2013.01); *H01L 23/49816* (2013.01); *H01L 23/49822* (2013.01);
(Continued)

(58) Field of Classification Search
CPC ....... H01L 24/04–09; H01L 2224/0801–0805; H01L 24/08; H01L 24/16
See application file for complete search history.

(56) References Cited

U.S. PATENT DOCUMENTS 7,521,287 B2 4/2009 Daubenspeck et al.
8,697,566 B2 4/2014 Chi
(Continued)

FOREIGN PATENT DOCUMENTS

KR 10-2016-0085197 A 7/2016
KR 10-2017-0067180 A 6/2017
KR 10-2020-0052893 A 5/2020

OTHER PUBLICATIONS

MKTPCB, "Everything You Need to Know about PCB Drilling", Section: "What is Solder Mask", URL:https://www.mktpcb.com/pcb-capability/solder-mask/#:~:text=A%20solder%20mask%20also%20referred,protect%20them%20from%20environmental%20contaminants. (Year: 2021).*

*Primary Examiner* — Christine S. Kim
*Assistant Examiner* — Tyler J Wiegand
(74) *Attorney, Agent, or Firm* — Sughrue Mion, PLLC

(57) ABSTRACT

A semiconductor package is provided. The semiconductor package includes a first structure with a first insulating layer and a connection pad which penetrates through the first insulating layer; and a second structure with a second insulating layer bonded to the first insulating layer and a pad structure provided in a recess portion of the second insulating layer. The pad structure is bonded to and wider than the connection pad. The pad structure includes: an electrode pad disposed on a bottom surface of the recess portion; a solder disposed on the electrode pad and bonded to the connection pad; and a conductive support disposed to surround a side surface of the solder on the electrode pad and bonded to the first insulating layer. A melting point of the conductive support is higher than a melting point of the solder.

20 Claims, 21 Drawing Sheets

A

(52) U.S. Cl.
CPC .... *H01L 23/49833* (2013.01); *H01L 25/0657*
(2013.01); *H01L 2224/05017* (2013.01); *H01L*
*2224/05554* (2013.01); *H01L 2224/05555*
(2013.01); *H01L 2224/05557* (2013.01); *H01L*
*2224/05578* (2013.01); *H01L 2224/05624*
(2013.01); *H01L 2224/05644* (2013.01); *H01L*
*2224/05647* (2013.01); *H01L 2224/05655*
(2013.01); *H01L 2224/05669* (2013.01); *H01L*
*2224/05684* (2013.01); *H01L 2224/0801*
(2013.01); *H01L 2224/08146* (2013.01); *H01L*
*2224/08148* (2013.01); *H01L 2224/08235*
(2013.01); *H01L 2224/80203* (2013.01); *H01L*
*2224/80895* (2013.01); *H01L 2224/80896*
(2013.01); *H01L 2225/06524* (2013.01); *H01L*
*2225/06541* (2013.01); *H01L 2924/1431*
(2013.01); *H01L 2924/1434* (2013.01); *H01L*
*2924/1811* (2013.01); *H01L 2924/1815*
(2013.01); *H01L 2924/182* (2013.01); *H01L*
*2924/37001* (2013.01)

(56) References Cited

U.S. PATENT DOCUMENTS

| | | | |
|---|---|---|---|
| 8,922,011 | B2 | 12/2014 | Osumi et al. |
| 9,704,818 | B1 | 7/2017 | Lin |
| 9,780,063 | B2 | 10/2017 | Choi et al. |
| 2007/0102827 | A1 | 5/2007 | Hogerton et al. |
| 2010/0190333 | A1* | 7/2010 | Park ........................ H01L 24/11 |
| | | | 438/615 |
| 2014/0103481 | A1 | 4/2014 | Ishizuka et al. |
| 2016/0086898 | A1* | 3/2016 | Jang .................... H01L 23/3135 |
| | | | 257/773 |
| 2016/0197055 | A1 | 7/2016 | Yu et al. |
| 2018/0294239 | A1* | 10/2018 | Sakata ............. H01L 23/49816 |
| 2019/0109042 | A1 | 4/2019 | Katkar et al. |
| 2019/0312013 | A1* | 10/2019 | Seo ..................... H01L 25/0657 |
| 2020/0211989 | A1 | 7/2020 | Bernard |
| 2022/0051989 | A1* | 2/2022 | Agarwal ................ H01L 24/20 |

* cited by examiner

1000A

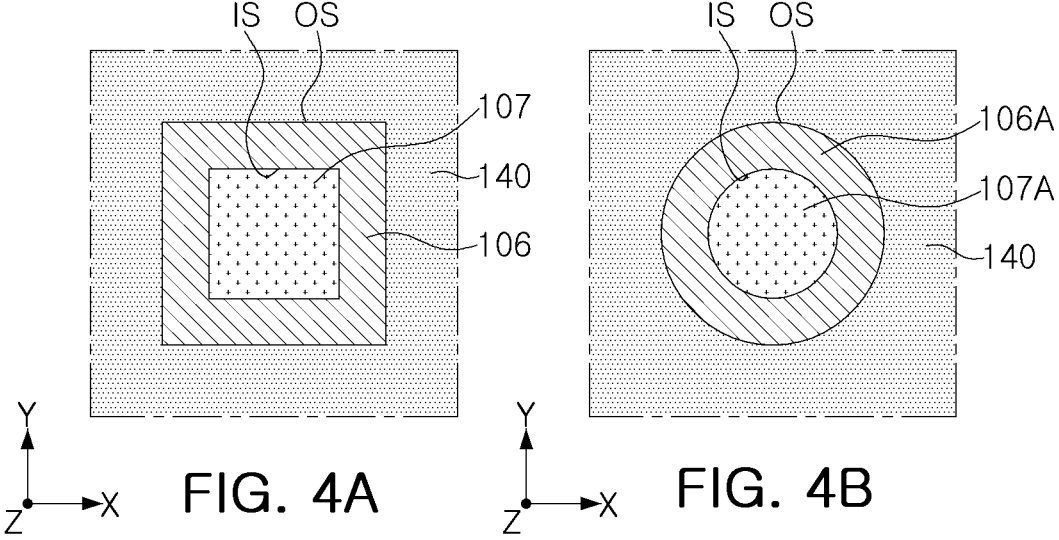
FIG. 4A
FIG. 4B
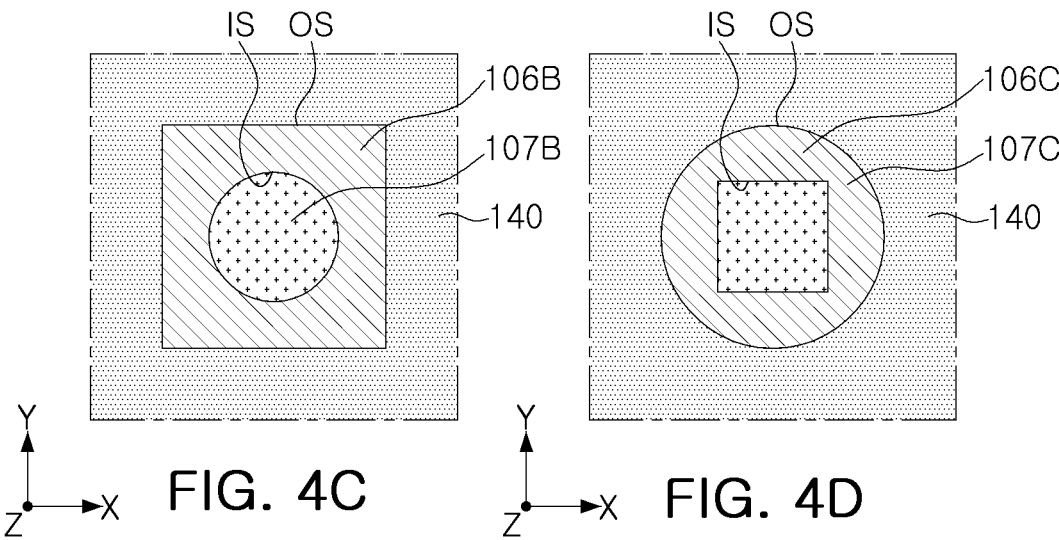
FIG. 4C
FIG. 4D

I-I'

SEMICONDUCTOR DEVICE COMPRISING A SOLDER SUPPORT TO PREVENT DEFORMATION DURING BONDING

CROSS-REFERENCE TO RELATED APPLICATION(S)

This application claims priority to Korean Patent Application No. 10-2021-0077601 filed on Jun. 15, 2021 in the Korean Intellectual Property Office, the disclosure of which is incorporated herein by reference in its entirety.

BACKGROUND

Methods, apparatuses and systems consistent with example embodiments relate to a semiconductor package.

A semiconductor package may contain one or more semiconductor devices. There is a continuous need to realize miniaturization, reduced weight, and increased performance, capacity and reliability of semiconductor packages. In this regard, research and development of a semiconductor package having a structure in which semiconductor chips are stacked in multiple stages have been continuously conducted.

SUMMARY

One or more example embodiments provide a semiconductor package having improved reliability and yield.

According to an aspect of an example embodiment, a semiconductor package includes a first structure including a first insulating layer and a connection pad which penetrates through the first insulating layer; and a second structure including a second insulating layer bonded to the first insulating layer and a pad structure provided in a recess portion of the second insulating layer. The pad structure is bonded to the connection pad and is wider than the connection pad. The pad structure includes: an electrode pad disposed on a bottom surface of the recess portion; a solder disposed on the electrode pad and bonded to the connection pad; and a conductive support disposed to surround a side surface of the solder on the electrode pad and bonded to the first insulating layer. A melting point of the conductive support is higher than a melting point of the solder.

According to an aspect of an example embodiment, a semiconductor package includes: a first semiconductor chip comprising a first insulating layer and a first pad structure which penetrates through the first insulating layer; and a second semiconductor chip comprising a second insulating layer bonded to the first insulating layer and a second pad structure provided in a recess portion of the second insulating layer, wherein the second pad structure is bonded to the first pad structure through the second insulating layer. The second pad structure includes: an electrode pad disposed on a bottom surface of the recess portion; a solder disposed on the electrode pad and bonded to the first pad structure; and a conductive support disposed to surround a side surface of the solder on the electrode pad. A melting point of the conductive support is higher than a melting point of the solder.

According to an aspect of an example embodiment, a semiconductor package includes: a package substrate; an interposer substrate disposed on the package substrate; and at least one semiconductor chip disposed on the interposer substrate and comprising a lower insulating layer and a lower pad structure which penetrates through the lower insulating layer. The interposer substrate includes: an upper insulating layer bonded to the lower insulating layer; and an upper pad structure which is provided in a recess portion of the upper insulating layer and is bonded to the lower pad structure. The upper pad structure includes: an upper electrode pad disposed on a bottom surface of the recess portion of the upper insulating layer; an upper solder disposed on the upper electrode pad and bonded to the lower pad structure; and an upper conductive support disposed to surround a side surface of the upper solder on the upper electrode pad. A melting point of the upper conductive support is higher than a melting point of the upper solder.

BRIEF DESCRIPTION OF DRAWINGS

The above and other aspects, features, and advantages will be more clearly understood from the following description, taken in conjunction with the accompanying drawings, in which:

FIG. 4A is a plan view of a pad structure of FIG. 2 according to an example embodiment;

FIGS. 4B, 4C and 4D are modified examples of the pad structure of FIG. 4A according to example embodiments.

DETAILED DESCRIPTION

Hereinafter, example embodiments will be described with reference to the accompanying drawings. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 1:
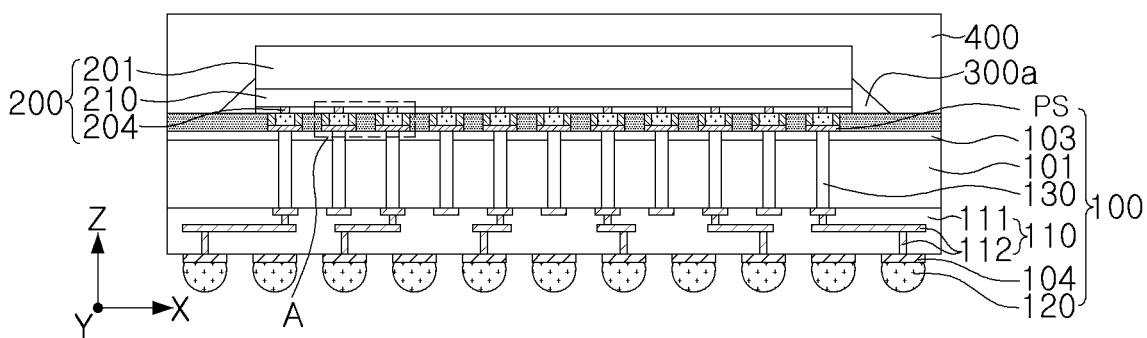
FIG. 1 is a cross-sectional view of a semiconductor package according to an example embodiment.

A semiconductor package according to an example embodiment will be described with reference to FIGS. 1 and 2. FIG. 1 is a cross-sectional view of a semiconductor package according to an example embodiment and FIG. 2 is an enlarged view of portion 'A' of FIG. 1.

Figure 2:
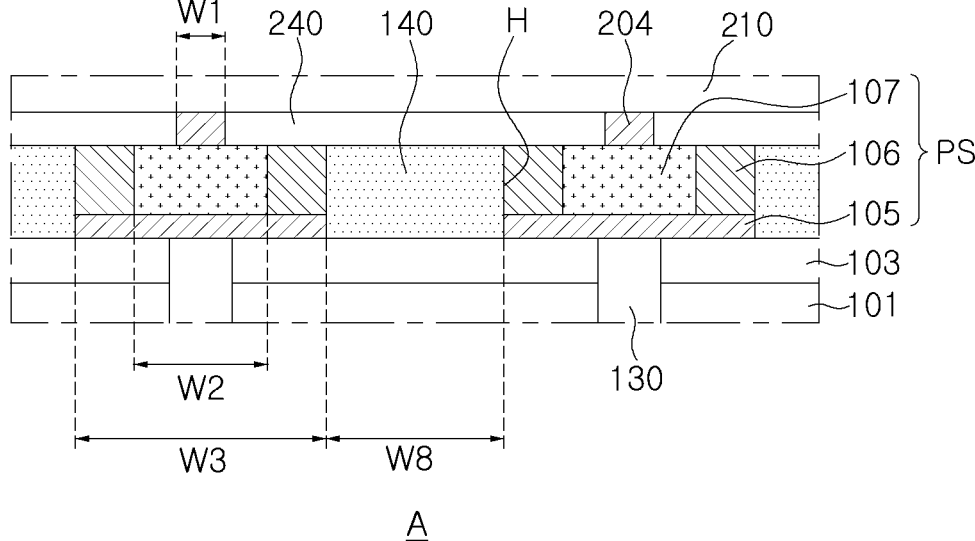
FIG. 2 is an enlarged view of portion 'A' of FIG. 1 according to an example embodiment.

Referring to FIGS. 1 and 2, a semiconductor package 1000A according to an example embodiment may include a base chip 100 and a semiconductor chip 200 bonded to each other. An upper insulating layer 140 and a pad structure PS may be disposed on a surface of the base chip 100 to be bonded to the semiconductor chip 200. A lower insulating layer 240 and a connection pad 204 may be disposed on a surface of the semiconductor chip 200 to be bonded to the base chip 100. The pad structure PS and the connection pad 204 may be directly bonded to each other to connect the base chip 100 and the semiconductor chip 200 to each other. The upper insulating layer 140 and the lower insulating layer 240 may be directly bonded to each other. In addition, the semiconductor package 1000A may further include an adhesive film 300a and an encapsulant 400.

The base chip 100 may include a semiconductor material, such as a silicon (Si) wafer, or the like, or a printed circuit board (PCB), or a glass substrate that does not include a semiconductor material according to example embodiments. In an example embodiment, the base chip 100 may include a substrate 101, an upper protective layer 103, an electrode pad 105, a lower pad 104, a device layer 110, an external connection terminal 120, and a through silicon via (TSV) 130. However, when the base chip 100 is a PCB or a glass substrate not including a semiconductor material, the device layer 110 and the TSV 130 may be omitted from the base chip 100.

The base chip 100 may be, for example, a buffer chip including a plurality of logic devices and/or memory devices in the device layer 110. Therefore, the base chip 100 may provide signals from the semiconductor chip 200 stacked thereon to external devices, and may also provide signals and power from the outside to the semiconductor chip 200. The base chip 100 may perform both a logic function and a memory function through logic devices and memory devices, but according to an example embodiment, the base chip 100 may include only logic devices to perform only a logic function.

The substrate 101 may include, for example, a semiconductor element such as silicon or germanium (Ge) or a compound semiconductor such as silicon carbide (SiC), gallium arsenide (GaAs), indium arsenide (InAs), or indium phosphide (InP). The substrate 101 may have a silicon on insulator (SOI) structure. The substrate 101 may include a conductive region, for example, a well doped with an impurity or a structure doped with an impurity. The substrate 101 may include various device isolation structures such as a shallow trench isolation (STI) structure.

The upper protective layer 103 may be formed on an upper surface of the substrate 101 and may protect the substrate 101. The upper protective layer 103 may be formed as an insulating layer such as a silicon oxide film, a silicon nitride film, or a silicon oxynitride film, but a material of the upper protective layer 103 is not limited thereto. For example, the upper protective layer 103 may also be formed of a polymer such as polyimide (PI). A lower protective layer may be further formed on the lower surface of the device layer 110.

The upper insulating layer 140 may be disposed on the upper protective layer 103. The upper insulating layer 140 may include at least one of a solder resistor and a photo-imageable dielectric (PID). In the upper insulating layer 140, a recess portion H in which a pad structure PS is disposed may be disposed through the upper insulating layer 140. The recess portion H may be disposed so that the TSV 130 is positioned on a bottom surface.

The pad structure PS may include an electrode pad 105, a solder 107, and a conductive support 106. The pad structure PS may have a width W3 greater than a width W1 of the connection pad 204 disposed in the semiconductor chip 200. For example, when the width W1 of the connection pad 204 is about 8 μm to about 14 μm, the width W4 of the pad structure PS may be about 13 μm to about 23 μm and may be greater than the connection pad 204.

The electrode pad 105 may be disposed in the recess portion H of the upper insulating layer 140. The electrode pad 105 may be disposed on a bottom surface of the recess portion H and may be electrically connected to the TSV 130. For example, the electrode pad 105 may cover the bottom surface of the recess portion H. The electrode pad 105 may have a circular or polygonal shape. The electrode pad 105 may include, for example, at least one of aluminum (Al), copper (Cu), nickel (Ni), tungsten (W), platinum (Pt), and gold (Au). The electrode pad 105 may be used as a seed metal layer for forming the conductive support 106 disposed thereon.

Figure 3A:
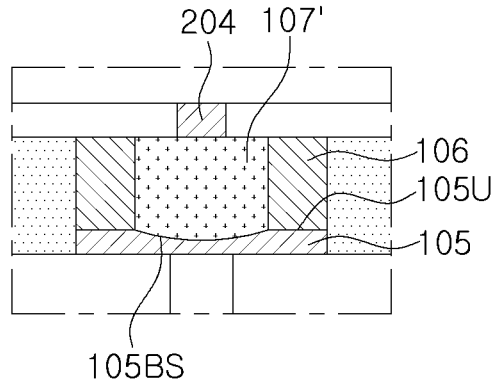
FIGS. 3A and 3B are modified examples of a pad structure of FIG. 2 according to example embodiments.
Figure 3B:
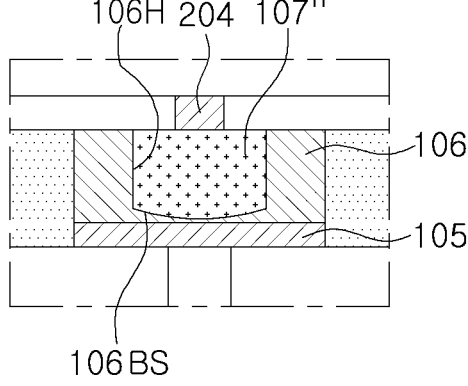

The solder 107 may be disposed in a central region of an upper portion of the electrode pad 105 to correspond to the connection pad 204. The solder 107 is a region bonded to the connection pad 204 of the semiconductor chip 200 and may have a width W2 greater than the width W1 of the connection pad 204. For example, when the width W1 of the connection pad 204 is about 8 μm to about 14 μm, the width W2 of the solder 107 may be about 10 μm to about 20 μm and may be greater than the connection pad 204. For example, the solder 107 may include tin (Sn), indium (In), bismuth (Bi), antimony (Sb), copper (Cu), silver (Ag), zinc (Zn), lead (Pb), and/or alloys thereof. The solder 107 may be formed to have the same level to be coplanar with the conductive support 106, but is not limited thereto and the solder 107 may be disposed to have an upper surface higher or lower than an upper surface of the conductive support 106 according to a range allowed in the process. In addition, according to an example embodiment, as illustrated in FIG. 3A, a lower surface of a solder 107' may be formed to fill a concave surface 105BS formed on an upper surface 105U of the electrode pad 105. In addition, as illustrated in FIG. 3B, a lower surface of a solder 107" may be formed on a concave surface 106BS formed on a bottom surface of a recess portion 106H of the conductive support 106. For example, the solder 107" may cover the concave surface 106BS.

Referring to FIG. 2, the conductive support 106 may be disposed to surround a side surface of the solder 107 on the electrode pad 105. Referring to FIG. 3A, the conductive support 106 may be disposed to surround each side of the solder 107', thereby separating the upper insulating layer 140 and the solder 107' from each other. As illustrated in FIG. 4A, when viewed from above, the conductive support 106 may be disposed to surround the solder 107. In addition, the conductive support 106 may have a rectangular inner surface IS and a rectangular outer surface OS, but is not limited thereto, and may have various shapes such as a circle or a polygon.

FIGS. 4B, 4C and 4D are modified examples of the conductive support 106 illustrated in FIG. 4A. As illustrated in FIG. 4B, a conductive support 106A may have a circular outer surface OS and a circular inner surface IS so that a solder 107A has a circular cross-section. In addition, as illustrated in FIG. 4C, a conductive support 106B may have a circular inner surface IS and a quadrangular outer surface OS so that a solder 107B has a circular cross section. In addition, as illustrated in FIG. 4D, a conductive support 106C may have a rectangular inner surface IS and a circular outer surface OS so that a solder 107C has a rectangular cross section.

Referring back to FIG. 2, the conductive support 106 may be bonded to the lower insulating layer 240 of the semiconductor chip 200. However, according to an example embodiment, a portion of the conductive support 106 may also be bonded to the connection pad 204.

The conductive support 106 and the solder 107 may be formed of different materials. The conductive support 106 may be formed of a material having a melting point higher than that of that of the solder 107. For example, the conductive support 106 may be formed of a material having a melting point of 300° C. or higher. In addition, the conductive support 106 may include at least one of aluminum (Al), copper (Cu), nickel (Ni), tungsten (W), platinum (Pt), and gold (Au). The conductive support 106 may be formed of the same material as that of the electrode pad 105, but is not limited thereto, and may be formed of a material different from that of the electrode pad 105. For example, the solder 107 may be formed of tin (Sn), indium (In), bismuth (Bi), antimony (Sb), copper (Cu), silver (Ag), zinc (Zn), lead (Pb) and/or an alloy thereof. For example, the solder 107 may be formed of a material having a melting point of 313° C. or higher.

Referring to FIG. 1, the lower pad 104 may be disposed below the device layer 110 and may include a material similar to that of the electrode pad 105. However, the materials of the electrode pad 105 and the lower pad 104 are not limited to the above materials.

The device layer 110 is disposed on a lower surface of the substrate 101 and may include various types of devices. For example, the device layer 110 may include a field effect transistor (FET) such as a planar FET or a FinFET, a memory such as a flash memory, a dynamic random access memory (DRAM), a static random access memory (SRAM), and an electrically erasable programmable read-only memory (EEPROM), a phase-change random access memory (PRAM), a magnetoresistive random access memory (MRAM), a ferroelectric random access memory (FeRAM), or a resistive random access memory (RRAM), a logic device such as AND, OR, NOT, and various active and/or passive devices such as a system large scale integration (LSI), a CMOS imaging sensor (CIS), and a micro-electro-mechanical system (MEMS).

The device layer 110 may include an interlayer insulating layer 111 and a multilayer interconnection layer 112 on the devices described above. The interlayer insulating layer 111 may include silicon oxide or silicon nitride. The multilayer interconnection layer 112 may include multilayer interconnections and/or vertical contacts. The multilayer interconnection layer 112 may connect devices of the device layer 110 to each other, devices to a conductive region of the substrate 101, or devices to an external connection terminal 120.

The external connection terminal 120 may be disposed on the lower pad 104 and may be connected to the multilayer interconnection layer 112 in the device layer 110 or the TSV 130. The external connection terminal 120 may be formed of a solder ball. However, according to an example embodiment, the external connection terminal 120 may have a structure including a pillar and a solder. The semiconductor package 1000A may be mounted on an external substrate such as an interposer or a package substrate through the external connection terminal 120.

The TSV 130 may penetrate through the substrate 101 in the vertical direction (Z direction) and may provide an electrical path connecting the electrode pad 105 and the lower pad 104. The TSV 130 may include a conductive plug and a barrier layer surrounding the conductive plug. The conductive plug may include a metal material, for example, tungsten (W), titanium (Ti), aluminum (Al), or copper (Cu). The conductive plug may be formed by a plating process, a PVD process, or a CVD process. The barrier layer may include an insulating barrier layer and/or a conductive barrier layer. The insulating barrier layer may be formed of an oxide film, a nitride film, a carbide film, a polymer, or a combination thereof. A conductive barrier layer may be disposed between the insulating barrier layer and the conductive plug. The conductive barrier layer may include, for example, a metal compound such as tungsten nitride (WN), titanium nitride (TiN), or tantalum nitride (TaN). The barrier layer may be formed by a PVD process or a CVD process.

The semiconductor chip 200 is stacked on the base chip 100 and may include a substrate 201, a device layer 210, a lower insulating layer 240, and a connection pad 204. In the drawings, one semiconductor chip 200 is illustrated, but the number of semiconductor chips 200 is not limited thereto. For example, two or more semiconductor chips may be stacked on the base chip 100. The substrate 201 may have characteristics similar to those described for the substrate 101 of the base chip 100.

The device layer 210 may include a plurality of memory devices. For example, the device layer 210 may include volatile memory devices such as DRAM and SRAM, or nonvolatile memory devices such as PRAM, MRAM, FeRAM, or RRAM. For example, in the semiconductor package 1000A, the semiconductor chip 200 may include DRAM devices in the device layer 210. Accordingly, the semiconductor package 1000A may be used for a high bandwidth memory (HBM) product, an electro data processing (EDP) product, or the like.

The device layer 210 may include a multi-layer interconnection layer therebelow. The multilayer interconnection layer may have characteristics similar to those described for the multilayer interconnection layer 112 of the device layer 110 in the base chip 100. Accordingly, the devices of the device layer 210 may be electrically connected to the connection pad 204 through the multilayer interconnection layer. In an example, the base chip 100 may include a plurality of logic devices and/or memory devices in the device layer 110 and may be referred to as a buffer chip or a control chip according to a function thereof, whereas the semiconductor chip 200 may include a plurality of memory devices in the device layer 210 and may be referred to as a core chip.

The lower insulating layer 240 may be disposed on a lower surface of the device layer 210. The lower insulating layer 240 may be formed of an insulating material. For example, the lower insulating layer 240 may be a non-conductive film (NCF).

The connection pad 204 may be disposed below the device layer 210, may penetrate through the lower insulating layer 240, and may be connected to the devices of the device layer 210 through interconnection of the multilayer interconnection layer. The width W1 of the connection pad 204 may be less than the width W2 of the solder 107. The connection pad 204 may be bonded to the solder 107 disposed on the pad structure PS of the base chip 100 to electrically connect the semiconductor chip 200 and the base chip 100 to each other. The connection pad 204 may have a cylindrical or polygonal column shape such as a square or octagonal column and may include, for example, nickel (Ni), copper (Cu), palladium (Pd), platinum (Pt), or gold (Au) or a combination thereof.

The adhesive film 300a may be disposed between the base chip 100 and the semiconductor chip 200 to surround a side surface of the semiconductor chip 200 and may fix the semiconductor chip 200 on the base chip 100. The adhesive film 300a may be a NCF, but is not limited thereto, and may include, for example, any type of polymer film capable of performing a pressure-reflow process.

The encapsulant 400 may be disposed on the base chip 100, and may be provided on a portion of the upper surface of the base chip 100, the upper surface and side surfaces of the semiconductor chip 200, and the side surface of the adhesive film 300a. The encapsulant 400 may have a predetermined thickness and may be provided on the upper surface of the semiconductor chip 200. According to example embodiments, the encapsulant 400 may not cover the upper surface of the semiconductor chip 200. In this case, the upper surface of the semiconductor chip 200 may be exposed through the encapsulant 400. The encapsulant 400 may include, for example, epoxy molding compound (EMC), but the material of the encapsulant 400 is not particularly limited.

Because the pad structure PS of an example embodiment includes the conductive support 106 disposed to surround the side surface of the solder 107, an occurrence of cracks due to a direct impact applied to the solder 107 may be prevented.

In addition, the conductive support 106 supports the solder 107 during a thermocompression bonding process in which the semiconductor chip 200 is attached to the base chip 100. By supporting the solder 107, the pad structure PS may be prevented from being deformed. As a result, it is possible to minimize an occurrence of warpage in the base chip 100 due to deformation of the pad structure PS in the thermocompression bonding process.

In addition, because the conductive support 106 is formed of a material having a melting point higher than that of a melting point of the solder 107, even if the solder 107 is heated above the melting point in the thermocompression bonding process, the conductive support 106 may remain in a solid state. Accordingly, the conductive support 106 may act as a dam and prevent the liquefied solder 107 from penetrating into the upper insulating layer 140 and may prevent the adjacent pad structures from being short-circuited with each other. In this manner, because insulation of the adjacent pad structures is secured, a joint gap (W8 of FIG. 2), an interval between the pad structures, may be further reduced. For example, in an example embodiment, the joint gap between the pad structures PS may be reduced to about 10 μm or less.

Figure 5:
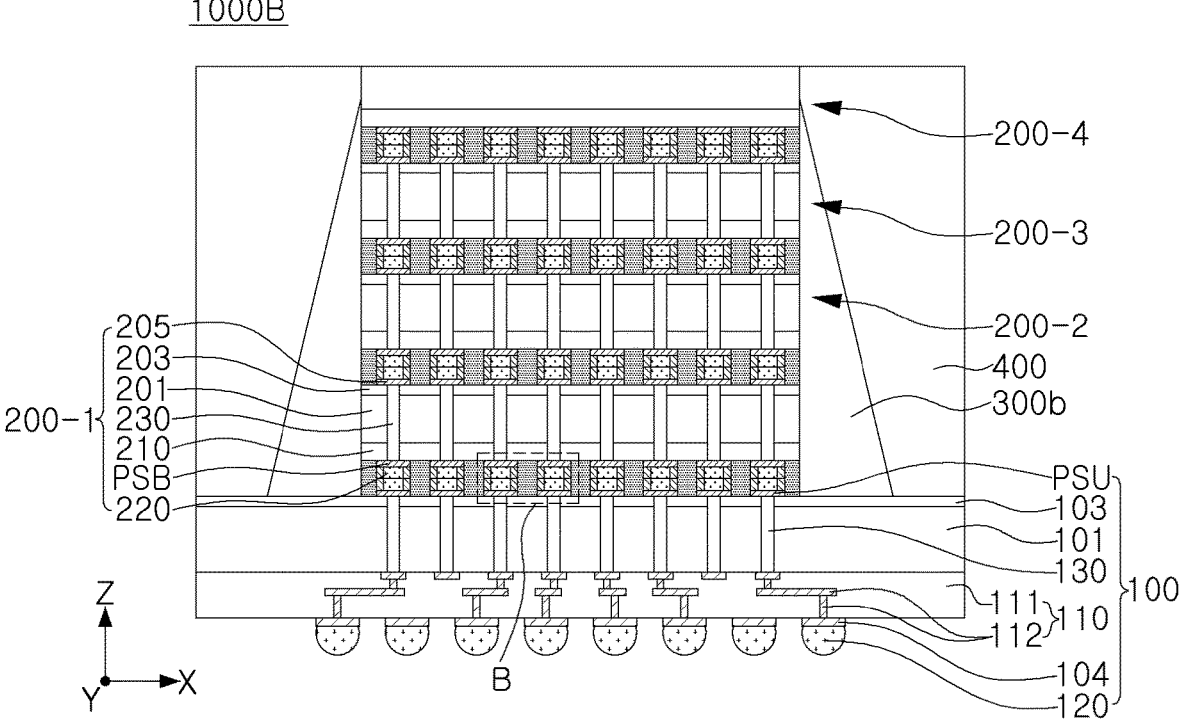
FIG. 5 is a cross-sectional view of a semiconductor package according to an example embodiment.

A semiconductor package according to an example embodiment will be described with reference to FIGS. 5 and 6. FIG. 5 is a cross-sectional view of a semiconductor package according to an example embodiment, and FIG. 6 is an enlarged view of portion 'B' of FIG. 5.

Figure 6:
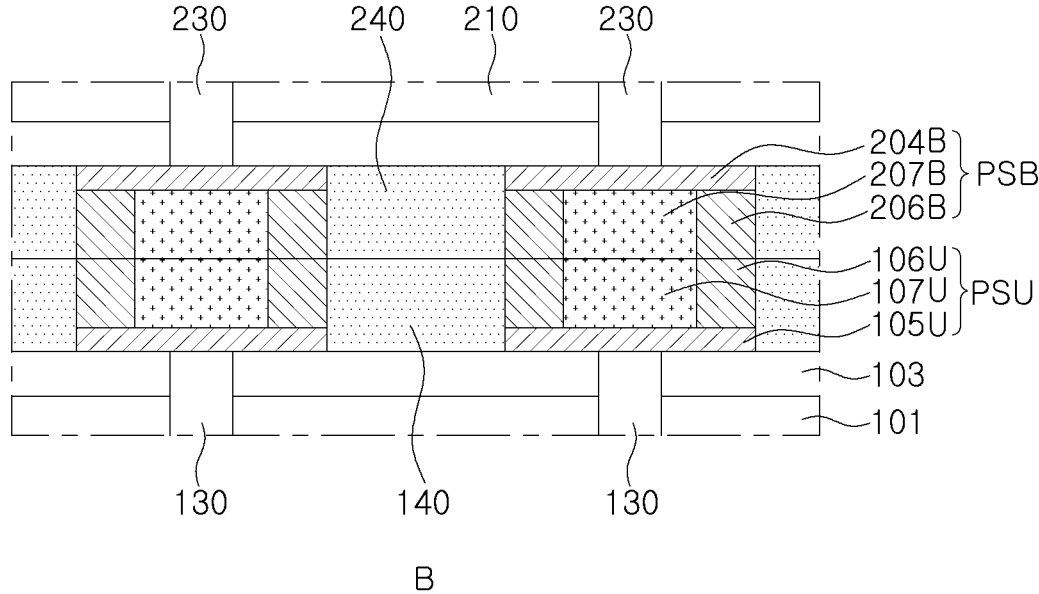
FIG. 6 is an enlarged view of portion 'B' of FIG. 6 according to an example embodiment.

Referring to FIGS. 5 and 6, a semiconductor package 1000B according to an example embodiment includes a plurality of semiconductor chips 200-1, 200-2, 200-3, and 200-4 stacked on the base chip 100. In addition, in the semiconductor package 1000A illustrated in FIG. 1, the pad structure PS is disposed on the base chip 100, the connection pad 204 is disposed in the semiconductor chip 200, so that the pad structure PS and the connection pad 204 are bonded to each other. In contrast, in the semiconductor package 1000B according to an example embodiment, an upper pad structure PSU and a lower pad structure PSB are disposed in the base chip 100 and the first semiconductor chip 200-1, respectively, so that the upper pad structure PSU and the lower pad structure PSB are bonded to each other. Although it is illustrated that the upper pad structure PSU and the lower pad structure PSB are respectively disposed in the plurality of semiconductor chips 200-1, 200-2, 200-3, and 200-4, example embodiments are not limited thereto and a connection pad may be disposed in any one of the semiconductor chips 200-1, 200-2, 200-3, and 200-4. Except for these points, the semiconductor package 1000B may be understood as having characteristics the same as or similar to those of the semiconductor package 1000A illustrated in FIGS. 1 and 2. Accordingly, descriptions overlapping those described above with reference to FIGS. 1 and 2 are omitted.

The semiconductor package 1000B includes, for example, first to fourth semiconductor chips 200-1, 200-2, 200-3, and 200-4 stacked on the base chip 100. The first to third semiconductor chips 200-1, 200-2, and 200-3 may be electrically connected to each other through the TSV 230. As discussed above, four semiconductor chips may be stacked on the base chip 100. However, example embodiments are not limited thereto and the number of semiconductor chips stacked on the base chip 100 may vary, and for example may be 2, 3, or 5 or more.

Each of the first to fourth semiconductor chips 200-1, 200-2, 200-3, and 200-4 may include a memory chip, similar to the semiconductor chip 200 described with reference to FIG. 1. However, each of the first to third semiconductor chips 200-1, 200-2, and 200-3 may include an upper protective layer 203 and an electrode pad 205 on an upper surface of the substrate 201 and the TSV 230 penetrating through the substrate 201, while the fourth semiconductor chip 200-4 may not include the upper protective layer 203, the electrode pad 205, and the TSV 230. As illustrated, the encapsulant 400 is not provided on the upper surface of the fourth semiconductor chip 200-4, but in an example, the upper surface of the fourth semiconductor chip 200-4 may be provided on the encapsulant 400.

Referring to FIGS. 5 and 6, an upper insulating layer 140 and an upper pad structure (PSU) may be disposed on an upper surface of the base chip 100, and a lower insulating layer 240 and a lower pad structure PS may be disposed on a lower surface of the first semiconductor chip 200-1. Because the upper insulating layer 140 and the lower insulating layer 240 have the same configuration as the lower insulating layer 240 of FIG. 2, a detailed description thereof is omitted. In addition, the upper pad structure PSU and the lower pad structure have the same configuration as the pad structure PS of FIG. 2, and thus, a detailed description thereof is omitted.

Referring to FIG. 6, the upper insulating layer 140 and the lower insulating layer 240 may be formed of the same material and may be bonded to each other.

The upper pad structure PSU and the lower pad structure PSB may have the same structure. Accordingly, an upper solder 107U and an upper conductive support 106U of the upper pad structure PSU may be bonded to a lower solder 207B and a lower conductive support 206B of the lower pad structure PSB, respectively. The lower solder 207B and the upper solder 107U may be formed of the same material, and the upper conductive support 106U and the lower conductive support 206U may be formed of the same material.

The upper pad structure PSU of an example embodiment may include an upper conductive support 106U disposed to surround the upper solder 107U, and the lower pad structure PSB may include the lower conductive support 206B disposed to surround the lower solder 207B. Accordingly, it is possible to prevent an impact from being directly applied to the upper solder 107U and the lower solder 207B to cause cracks. In addition, it is possible to minimize an occurrence of warpage in the base chip 100 due to deformation of the upper pad structure PSU and the lower pad structure PSB in the thermocompression bonding process. In addition, the upper conductive support 106U is formed of a material having a melting point higher than that of a melting point of the upper solder 107U and the lower conductive support 206B is formed of a material having a melting point higher than that of a melting point of the lower solder 207B, and thus, it is possible to prevent the adjacent pad structures from being short-circuited with each other. In this manner, because insulation of the adjacent pad structures is secured, a joint gap between the pad structures may be reduced.

Figure 7:
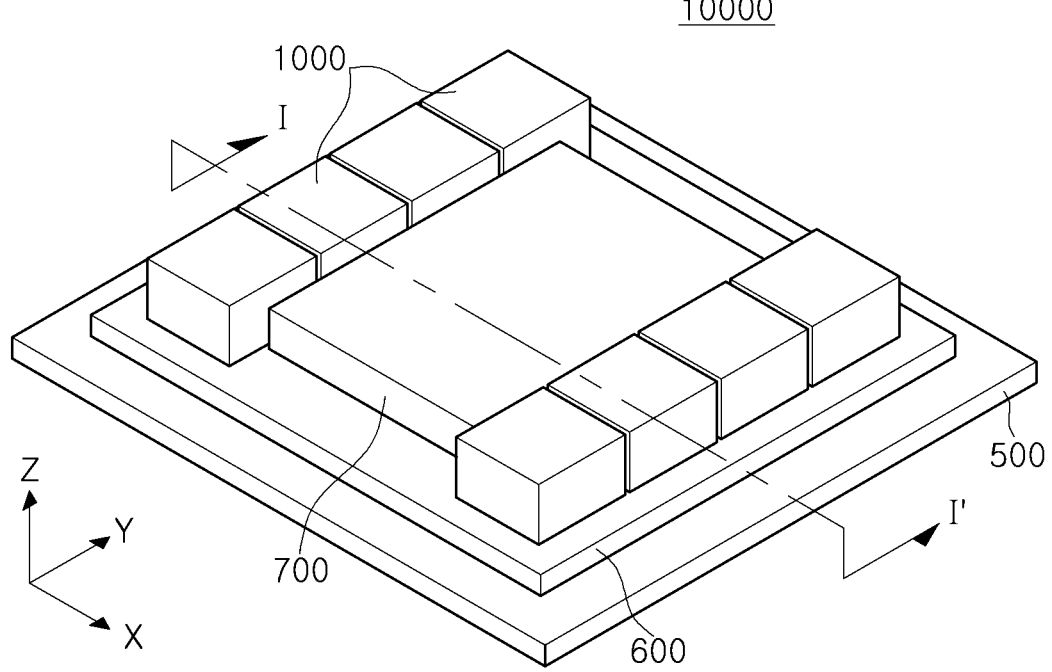
FIG. 7 is a perspective view of a semiconductor package according to an example embodiment.

A semiconductor package according to an example embodiment will be described with reference to FIGS. 7 and 8. FIG. 7 is a perspective view of a semiconductor package according to an example embodiment, and FIG. 8 is a cross-sectional view taken along line I-I' of FIG. 7.

Figure 8:
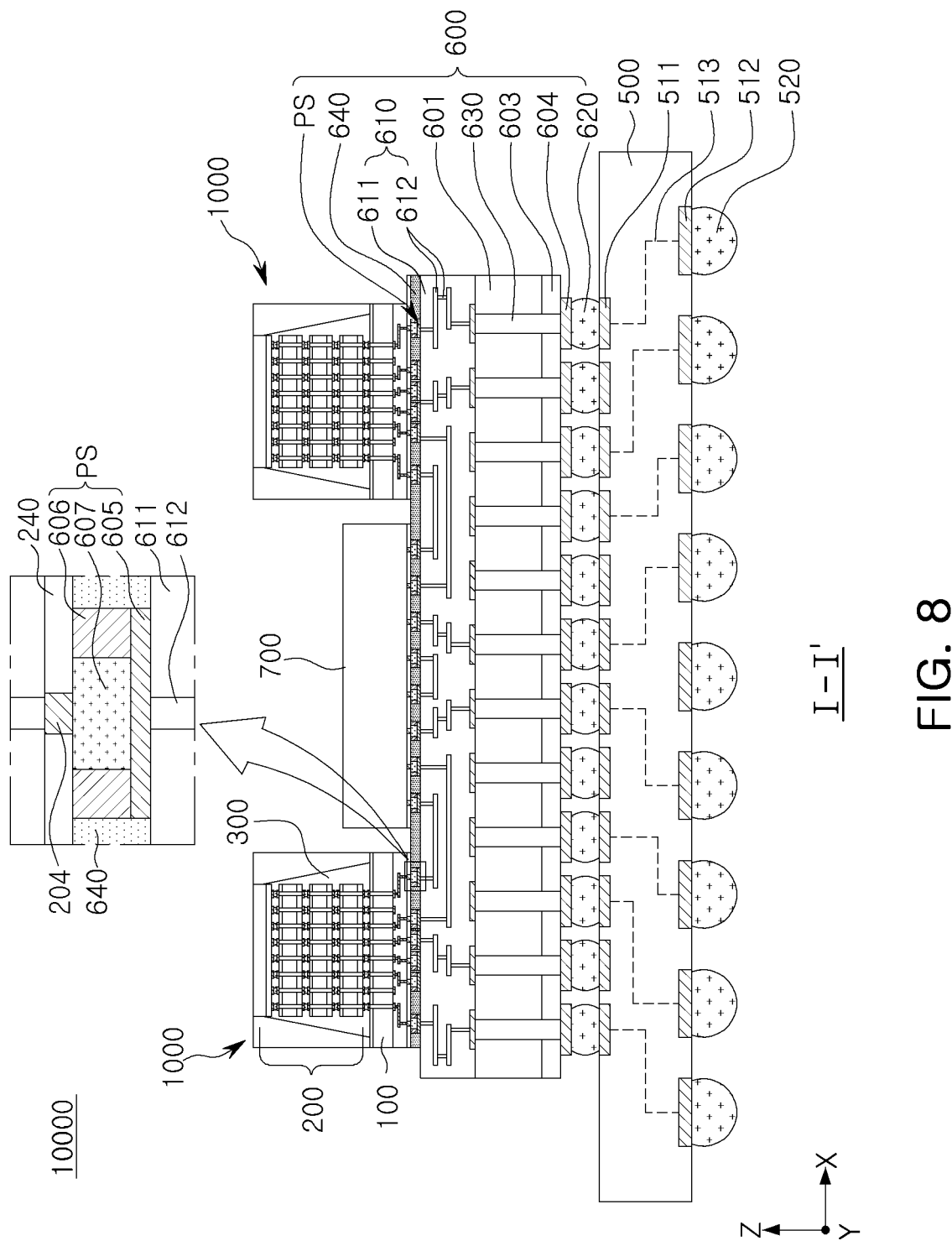
FIG. 8 is a cross-sectional view taken along line I-I' of FIG. 7 according to an example embodiment.

Referring to FIGS. 7 and 8, a semiconductor package 10000 according to an example embodiment may include a package substrate 500, an interposer substrate 600, and at least one semiconductor structure 1000. In addition, the semiconductor package 10000 may further include a semiconductor chip 700 disposed adjacent to the semiconductor structure 1000 on the interposer substrate 600.

Compared with the discussion with respect to FIGS. 1 and 2 above, in the semiconductor package 10000 of an example embodiment, the same lower insulating layer 240 and the connection pad 204 as the lower insulating layer 240 and the connection pad 204 of FIG. 2 are disposed in the semiconductor structure 1000 and/or the semiconductor chip 200, and the upper insulating layer 140 and the pad structure PS of FIG. 2 are disposed on the interposer substrate 600. The configuration of the lower insulating layer 240, the connection pad 204, the upper insulating layer 140, and the pad structure PS is the same as the configuration of the lower insulating layer 240, the connection pad 204, and the upper insulating layer 140, and the pad structure PS of FIG. 2 described above. Accordingly, descriptions overlapping those described above with reference to FIGS. 1 and 2 are omitted.

The package substrate 500 may include a lower pad 512 disposed on a lower surface of a body, an electrode pad 511 disposed on an upper surface of the body, and a redistribution circuit 513 electrically connecting the lower pad 512 to the electrode pad 511. The package substrate 500 may be a support substrate on which the interposer substrate 600 is mounted, and may be a substrate for a semiconductor package including a printed circuit board (PCB), a ceramic substrate, a glass substrate, a tape interconnection board, and the like. The body of the package substrate 500 may include different materials depending on a type of the substrate. For example, when the package substrate 500 is a PCB, the package substrate 500 may be a form in which an interconnection layer is additionally stacked on one side or both sides of a body copper clad laminate or a copper clad laminate. Solder resist layers may be respectively formed on lower and upper surfaces of the package substrate 500. The lower and upper pads 512 and 511 and the redistribution circuit 513 may form an electrical path connecting the lower surface and the upper surface of the package substrate 500. The lower and upper pads 512 and 511 and the redistribution circuit 513 may be formed of a metallic material, for example, copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C) or an alloy including two or more metals thereof. The redistribution circuit 513 may include multiple redistribution layers and vias connecting the redistribution layers. An external connection terminal 520 connected to the lower pad 512 may be disposed on a lower surface of the package substrate 500. The external connection terminal 520 may include tin (Sn), indium (In), bismuth (Bi), antimony (Sb), copper (Cu), silver (Ag), zinc (Zn), lead (Pb) and/or alloys thereof.

The interposer substrate 600 may include a substrate 601, a lower protective layer 603, a lower pad 604, an interconnection layer 610, an upper insulating layer 640, a pad structure (PS), and a bump 620, and a through-electrode 630. The semiconductor structure 1000 and the semiconductor chip 700 may be stacked on the package substrate 500 via the interposer substrate 600. The interposer substrate 600 may electrically connect the semiconductor structure 1000 and the semiconductor chip 700 to each other.

The substrate 601 may be formed of, for example, any one of silicon, an organic material, plastic, and a glass substrate. When the substrate 601 is a silicon substrate, the interposer substrate 600 may be referred to as a silicon interposer. Also, when the substrate 601 is an organic substrate, the interposer substrate 600 may be referred to as a panel interposer.

A lower protective layer 603 may be disposed on a lower surface of the substrate 601, and a lower pad 604 may be disposed on the lower protective layer 603. The lower pad 604 may be connected to the through-electrode 630. The semiconductor structure 1000 and the semiconductor chip 700 may be electrically connected to the package substrate 500 through bumps 620 disposed on the lower pad 604.

The interconnection layer 610 may be disposed on an upper surface of the substrate 601 and may include an interlayer insulating layer 611 and a single-layer or multi-layer interconnection structure 612. When the interconnection layer 610 has a multilayer interconnection structure, interconnections of different layers may be connected to each other through vertical contacts.

The upper insulating layer 640 may be disposed on the interconnection layer 610, and the pad structure PS may be disposed through the upper insulating layer 640. The pad structure PS may include an electrode pad 605, a solder 607, and a conductive support 606. The upper insulating layer 640 may be bonded to the lower insulating layer 240 of the semiconductor structure 1000, and the solder 607 may be bonded to the connection pad 204 of the semiconductor structure 1000.

The through-electrode 630 may extend from the upper surface to the lower surface of the substrate 601 to penetrate through the substrate 601. Also, the through-electrode 630 may extend into the interconnection layer 610 and may be electrically connected to the interconnections of the interconnection layer 610. When the substrate 601 is silicon, the through-electrode 630 may be referred to as a TSV. Other structures and materials of the through-electrode 630 are the same as those described for the semiconductor package 1000A of FIG. 1. According to an example embodiment, the interposer substrate 600 may include only an interconnection layer therein and may not include a through-electrode.

The interposer substrate 600 may be used for the purpose of converting or transferring an input electrical signal between the package substrate 500 and the semiconductor structure 1000 or the semiconductor chip 700. Accordingly, the interposer substrate 600 may not include devices such as active devices or passive devices. Also, according to an example embodiment, the interconnection layer 610 may be disposed below the through-electrode 630. For example, a positional relationship between the interconnection layer 610 and the through-electrode 630 may be relative.

The bump 620 may be disposed on the lower surface of the interposer substrate 600 and may be electrically connected to the interconnection of the interconnection layer 610. The interposer substrate 600 may be stacked on the package substrate 500 through the bump 620. The bump 620 may be connected to the lower pad 604 through the interconnections of the interconnection layer 610 and the through-electrode 630. In an example, some of the lower pads 604 used for power or grounding may be integrated and connected together to the bumps 620, so that the number of the lower pads 604 may be greater than the number of the bumps 620.

The semiconductor chip 700 may include, for example, a central processor (CPU), a graphics processor (GPU), a field programmable gate array (FPGA), a digital signal processor (DSP), a cryptographic processor, a microprocessor, a microcontroller, an analog-to-digital converter, and a logic chip such as an application-specific IC (ASIC).

The lower insulating layer 240 of the semiconductor structure 1000 may be disposed on a lower surface of the semiconductor chip 700, and the connection pad 204 may be disposed to penetrate through the lower insulating layer 240.

The semiconductor package 10000 according to an example embodiment may further include an internal sealant provided on the side and upper surfaces of the semiconductor structure 1000 and the semiconductor chip 700 on the interposer substrate 600. For example, the internal sealant may cover the side and upper surfaces of the semiconductor structure 1000 and the semiconductor chip 700 on the interposer substrate 600. In addition, the semiconductor package 10000 may further include an external sealant provided on the interposer substrate 600 and the internal sealant on the package substrate 500. For example, the external sealant may cover the interposer substrate 600 and the internal sealant on the package substrate 500. According to an example embodiment, the external sealant and the internal sealant may be formed together and may not be distinguished from each other. Also, in some example embodiments, the internal sealant may be provided on only the upper surface of the semiconductor chip 700 and may not be provided on the upper surface of the semiconductor structure 1000.

Because the pad structure PS of an example embodiment includes the conductive support 606 disposed to surround the solder 607, it is possible to prevent an impact from being directly applied to the solder 607 to cause cracks. In addition, it is possible to minimize an occurrence of warpage in the interposer substrate 600 due to deformation of the pad structure PS during a thermocompression bonding process. In addition, because the conductive support 606 is formed of a material having a melting point higher than that of the melting point of the solder 607, short-circuiting of adjacent pad structures may be prevented. In this manner, because insulation of the adjacent pad structures is secured, a joint gap between the pad structures may be reduced.

A method of manufacturing the package substrate illustrated in FIG. 8 will be described with reference to FIGS. 9 to 21. FIGS. 9 to 21 are schematic cross-sectional views illustrating a method of manufacturing the package substrate illustrated in FIG. 8.

Figure 9:
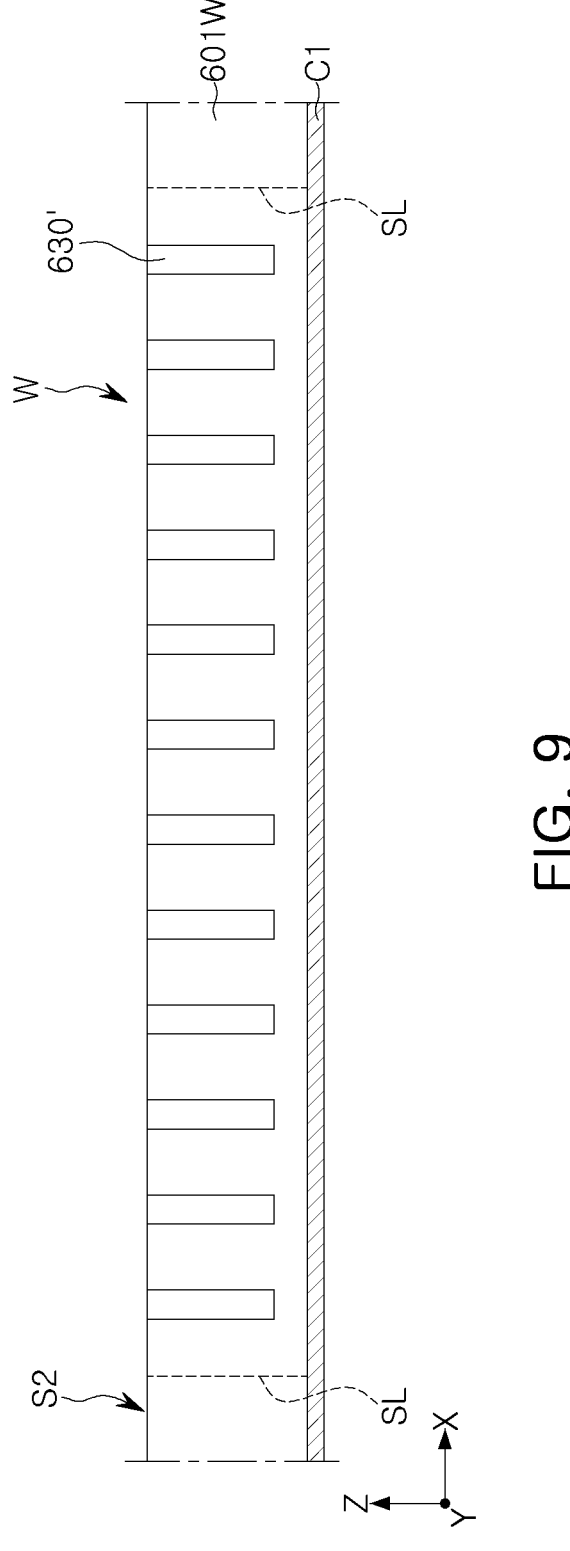
FIGS. 9 to 21 are schematic cross-sectional views illustrating a method of manufacturing a package substrate according to an example embodiment.

Referring to FIG. 9, first, a semiconductor wafer W is attached to a first carrier C1 and a through-electrode 630' extending into the semiconductor substrate 601W may be formed. The semiconductor wafer W may include a plurality of semiconductor substrates 601W separated by scribe lanes SL. The through-electrode 630' may extend inwardly from a second surface S2 of the semiconductor substrate 601W. The through-electrode 630' may have a pillar shape filling a via hole and may include a barrier layer formed on a surface of the pillar shape and a buried conductive layer filling the inside of the barrier layer. The through-electrode 630' may be formed using an etching process for forming a via hole and an oxidation process, a plating process, a planarization process, and the like, to form a barrier layer and a buried conductive layer in the via hole.

Figure 10:
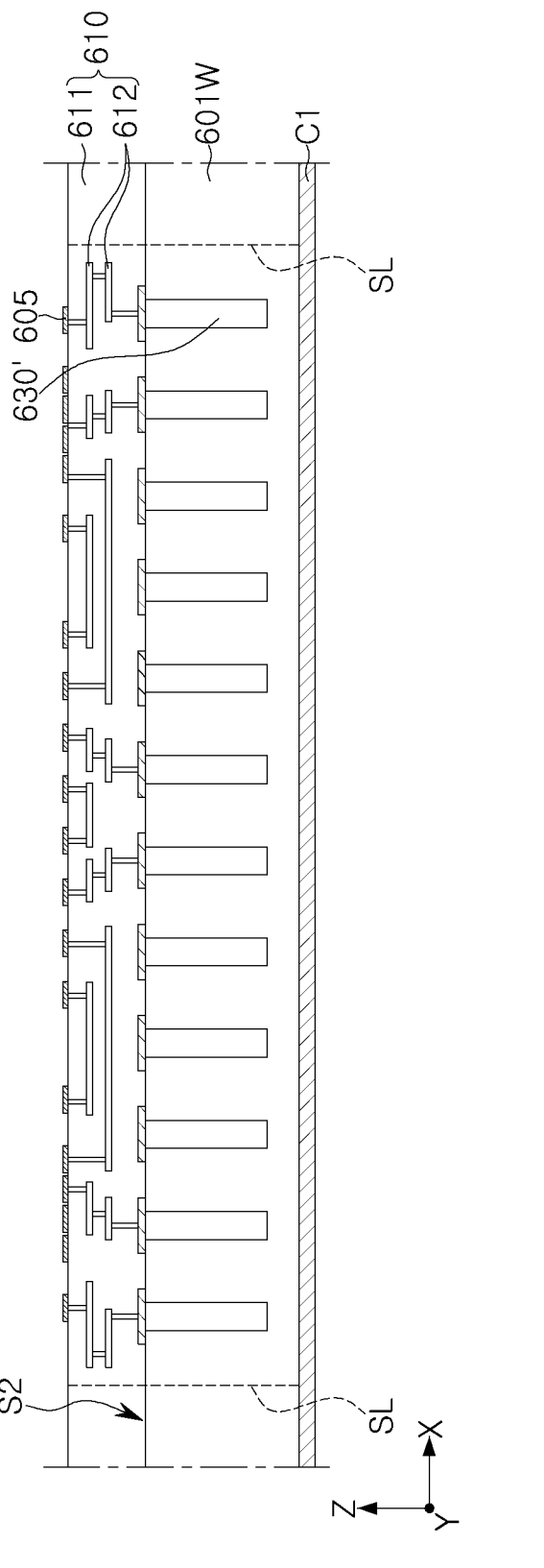

Referring to FIG. 10, an interconnection layer 610 may be formed on a plurality of semiconductor substrates 601W. The interconnection layer 610 may include an interlayer insulating layer 611 and an interconnection structure 612. The interlayer insulating layer 611 and the interconnection structure 612 may be formed by repeatedly performing an oxidation process, a photolithography process, an etching process, a plating process, and the like. An electrode pad 605 may be formed on the interconnection structure 612. The electrode pad 605 may be formed by depositing at least one of aluminum (Al), copper (Cu), nickel (Ni), tungsten (W), platinum (Pt), and gold (Au).

Figure 11:
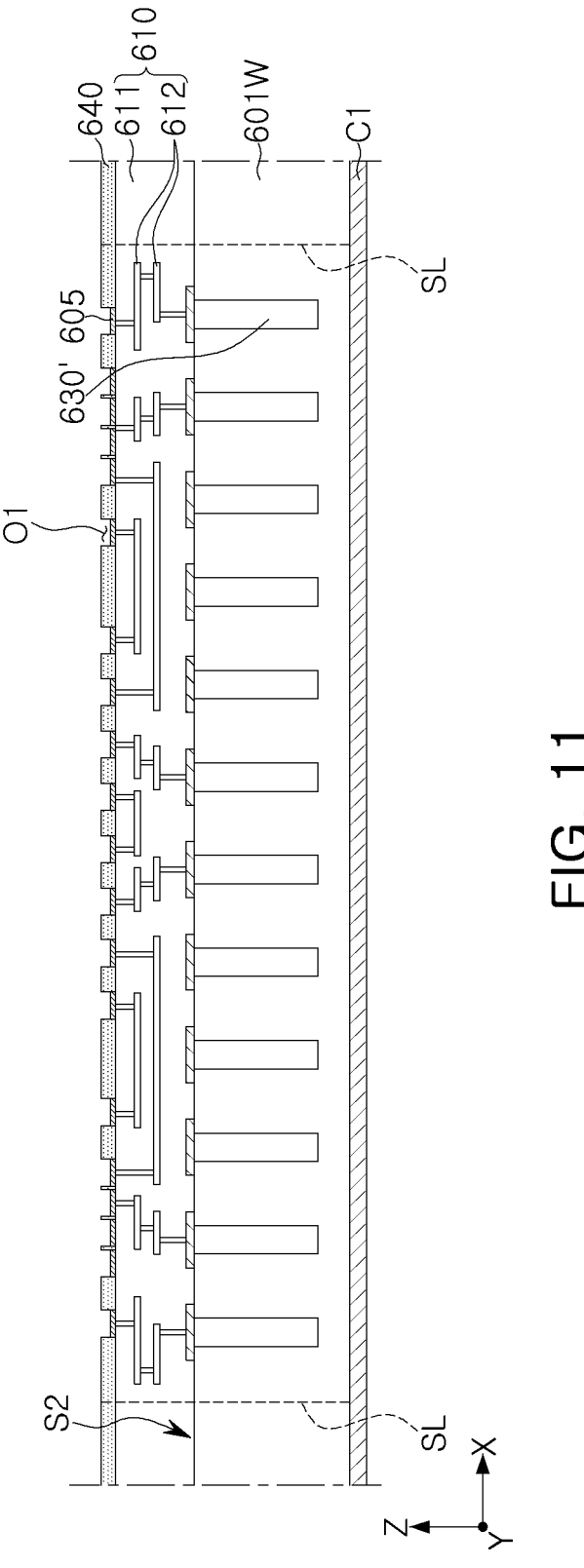

Referring to FIG. 11, a lower insulating layer 640 on the interconnection layer 610 may be formed. The lower insulating layer 640 may be provided by forming an insulating polymer film on the interconnection layer 610 and then forming a first opening O1 from by partially removing a portion of the insulating polymer film so that the electrode pad 605 is exposed. The insulating polymer film may be formed by applying a solder resist or a photosensitive insulating resin through a spin coating process or a spray process.

Figure 12:
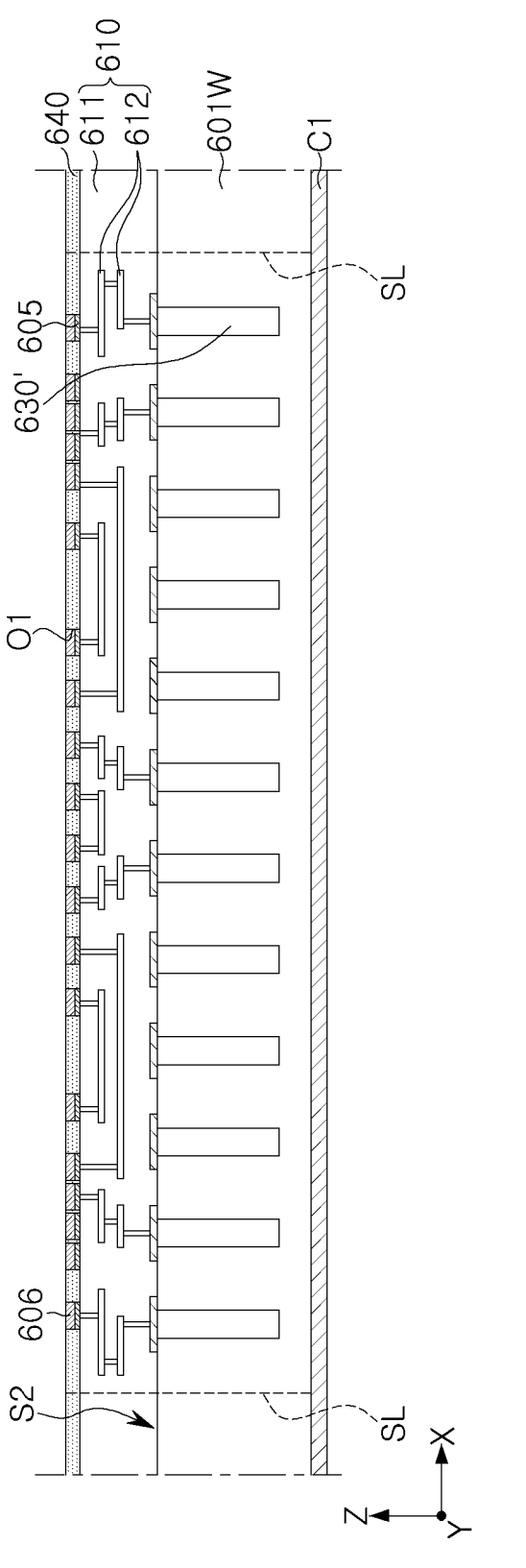

Referring to FIG. 12, a conductive support 606 may be formed to fill the first opening O1 of the lower insulating layer 640. The conductive support 606 may be formed by plating aluminum (Al), copper (Cu), nickel (Ni), and tungsten (W), platinum (Pt), and gold (Au) using the electrode pad 605 disposed at a lower portion of the first opening O1, as a seed metal layer.

Figure 13:
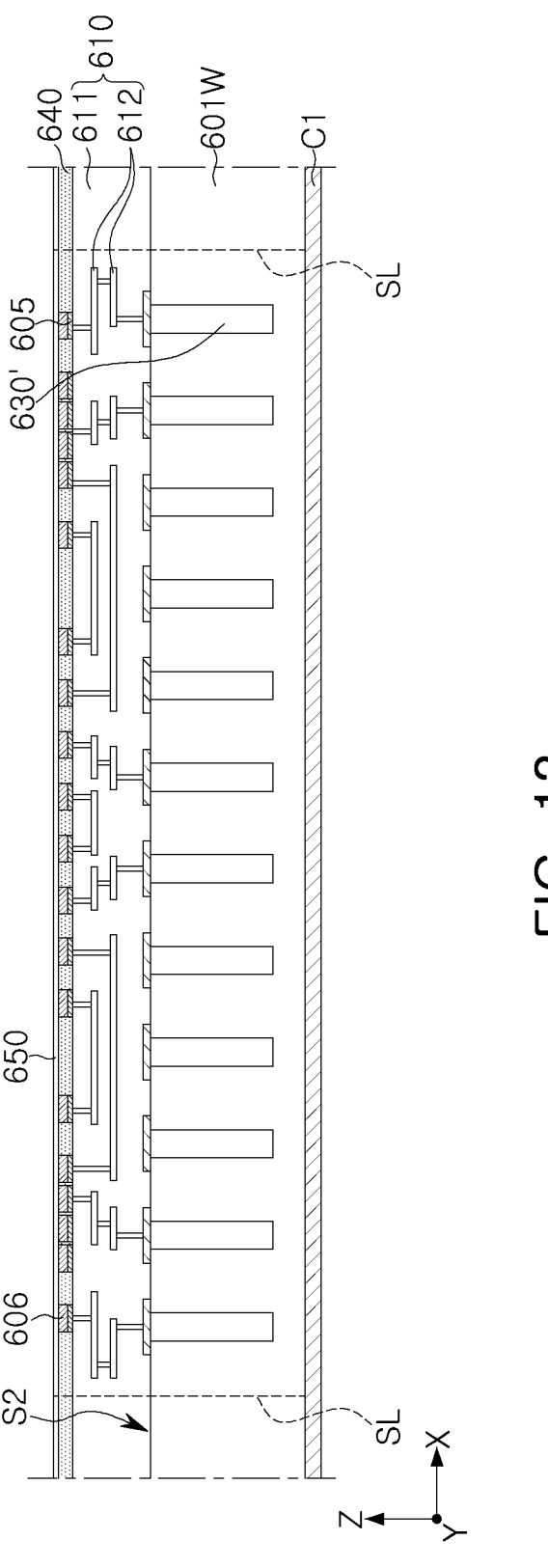

Referring to FIG. 13, a metal layer 650 may be deposited on the lower insulating layer 640 and the conductive support 606.

Figure 14:
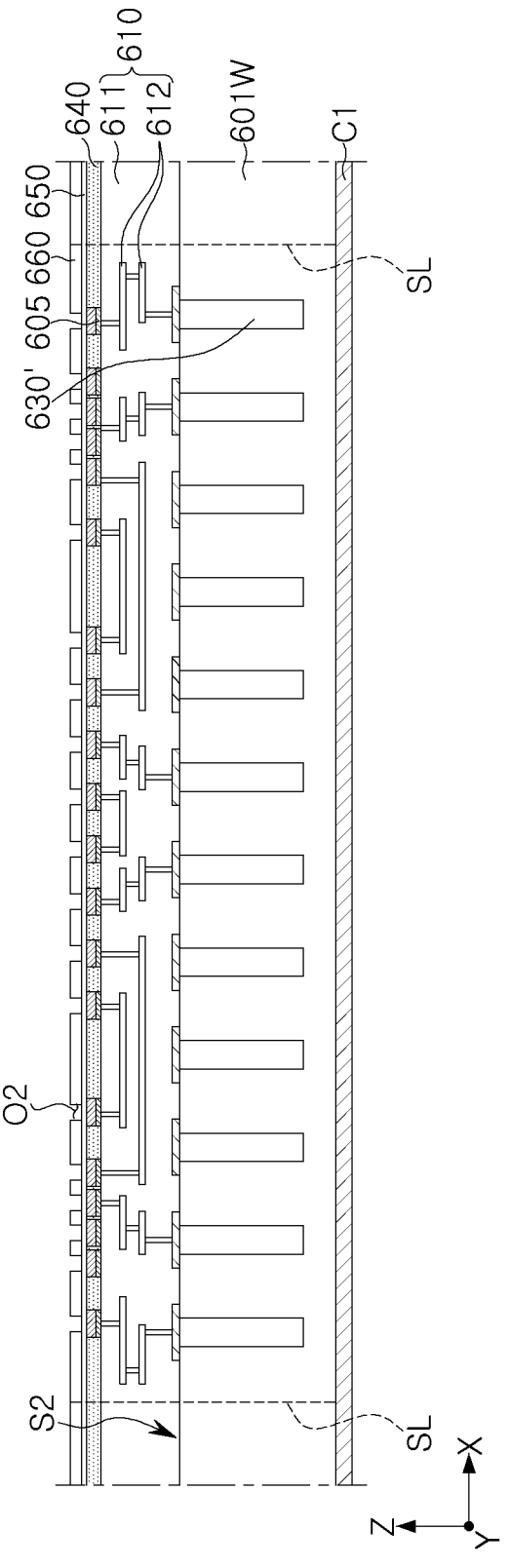

Referring to FIG. 14, a photoresist layer 660 on the metal layer 650 may be formed. The photoresist layer 660 may be prepared by applying photoresist on the metal layer 650 and then forming a second opening O2 by removing a portion corresponding to an upper portion of the conductive support 606 of the metal layer 650.

Figure 15:
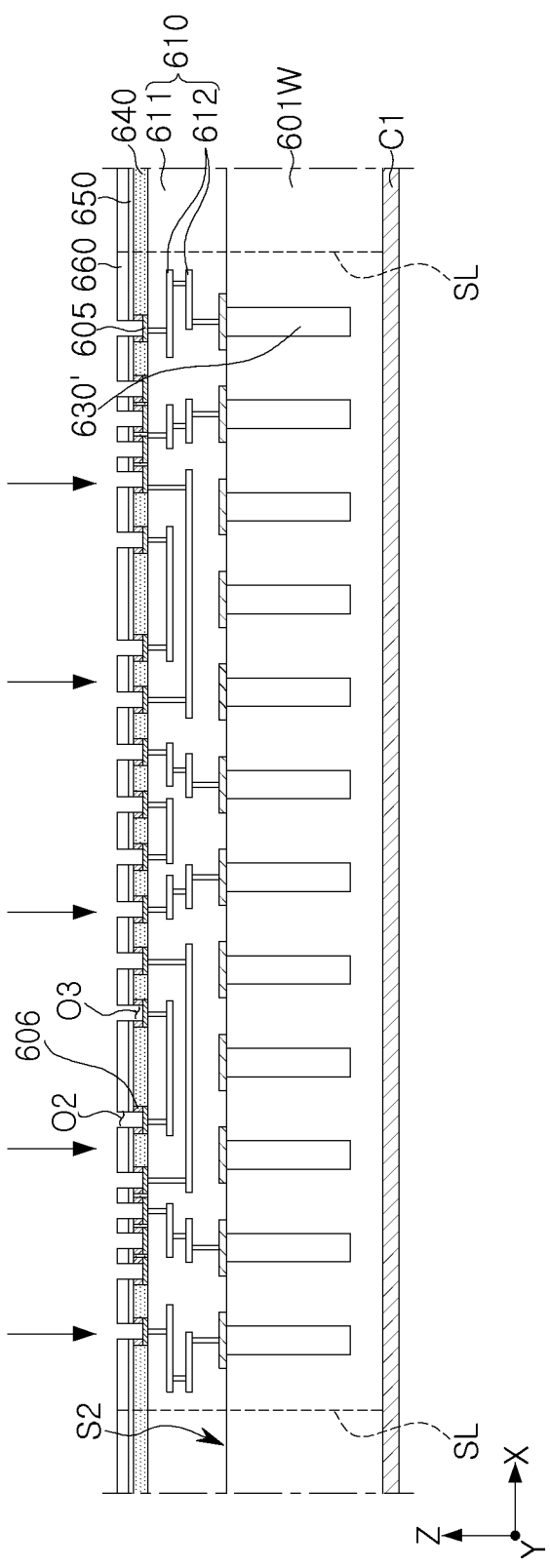

Referring to FIG. 15, a third opening O3 may be formed by removing the metal layer 650 and the conductive support 606 by performing an etching process through the second opening O2. The etching process may be performed through wet processing, and after the wet etching is completed, a cleaning process may be performed to clean the inside of the third opening O3. The etching process may be performed until the electrode pad 605 is exposed on a bottom surface of the third opening O3. However, example embodiments are not limited thereto, and the etching process may be completed in a state in which the electrode pad 605 is not exposed on the bottom surface of the third opening O3 in some example embodiments.

Figure 16:
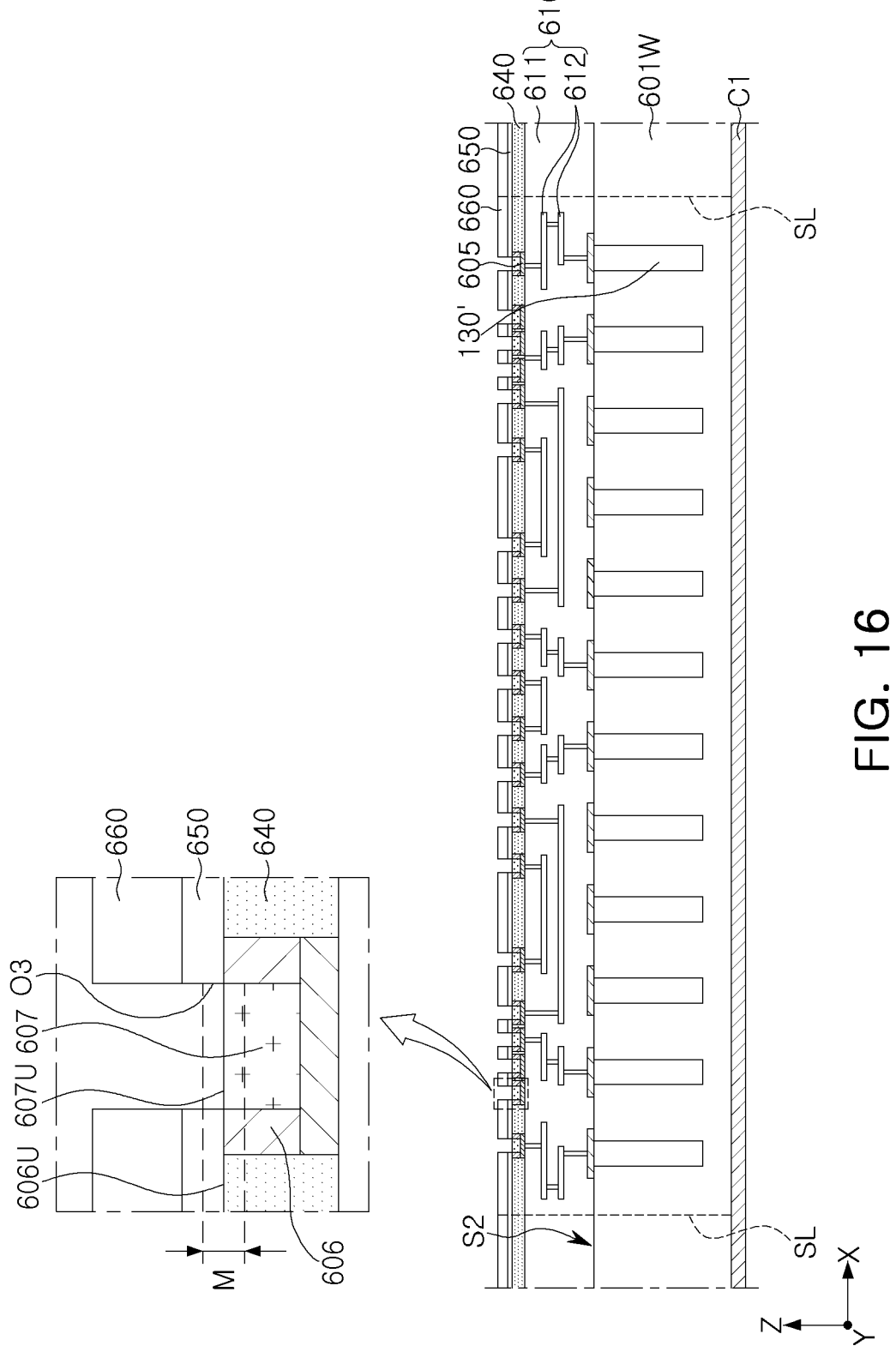

Referring to FIG. 16, a solder 607 may be formed in the third opening O3. The solder 607 may be formed by plating tin (Sn), indium (In), bismuth (Bi), antimony (Sb), copper (Cu), silver (Ag), zinc (Zn), lead (Pb) and/or an alloy thereof. The solder 607 may be formed so that an upper surface 607U has the same height as an upper surface 606U of the conductive support 606, but is not limited thereto, and according to the allowable range M in the process, the upper surface 607U may be higher or lower than the upper surface 606U of the conductive support 606.

Figure 17:
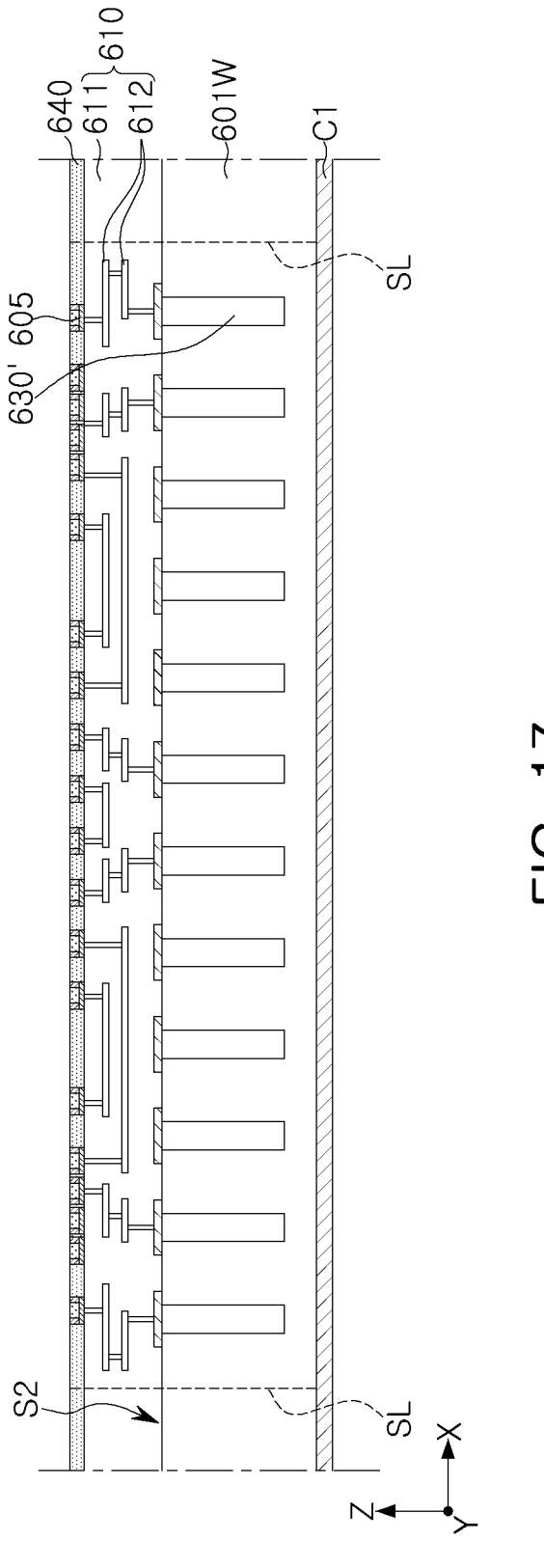

Referring to FIGS. 16 and 17, the photoresist layer 660 may be removed by etching the metal layer 650 through the third opening O3.

Figure 18:
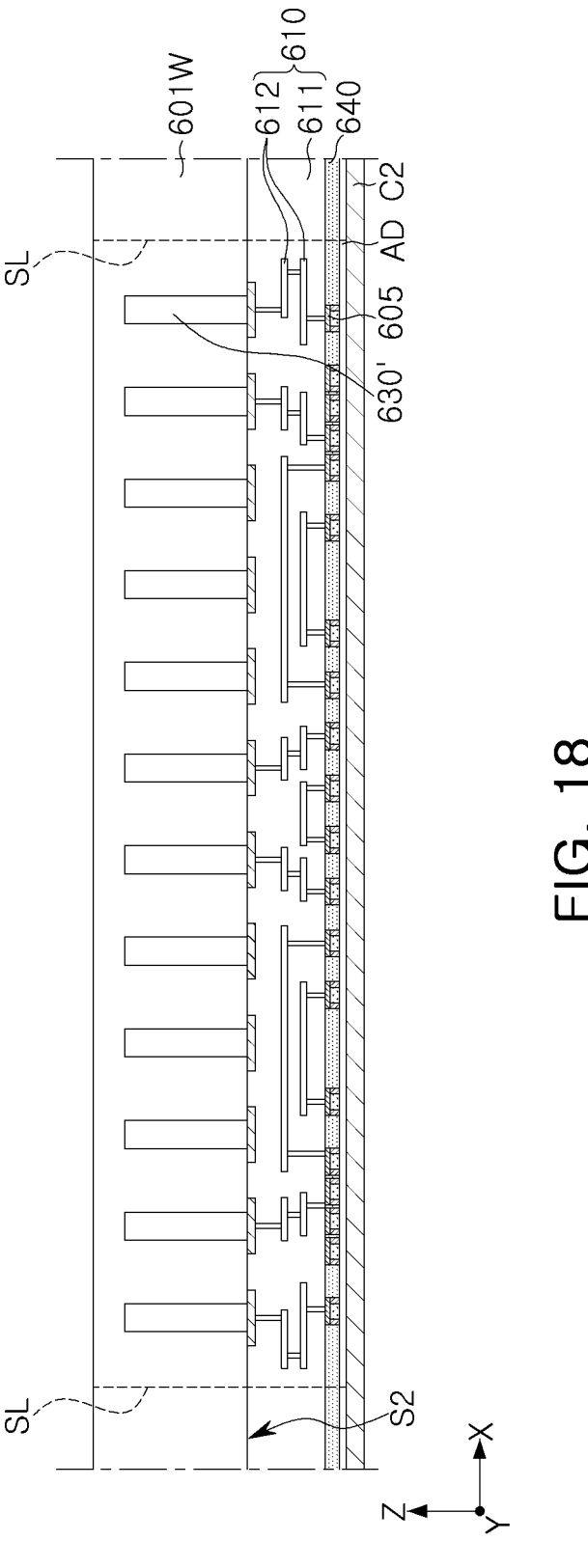

Referring to FIG. 18, the semiconductor substrate 601W of FIG. 17 may be inverted and attached to a second carrier C2. An adhesive layer AD is present on a surface of the second carrier C2, and a lower insulating layer 640, a conductive support 606, and a solder 607 may be attached to the adhesive layer AD. In this case, an upper portion of the through-electrode 630' is buried in the semiconductor substrate 601W, but in a subsequent process (FIGS. 19 and 20), a portion of the through-electrode 630' may be exposed and connected to the lower pad 604.

Figure 19:
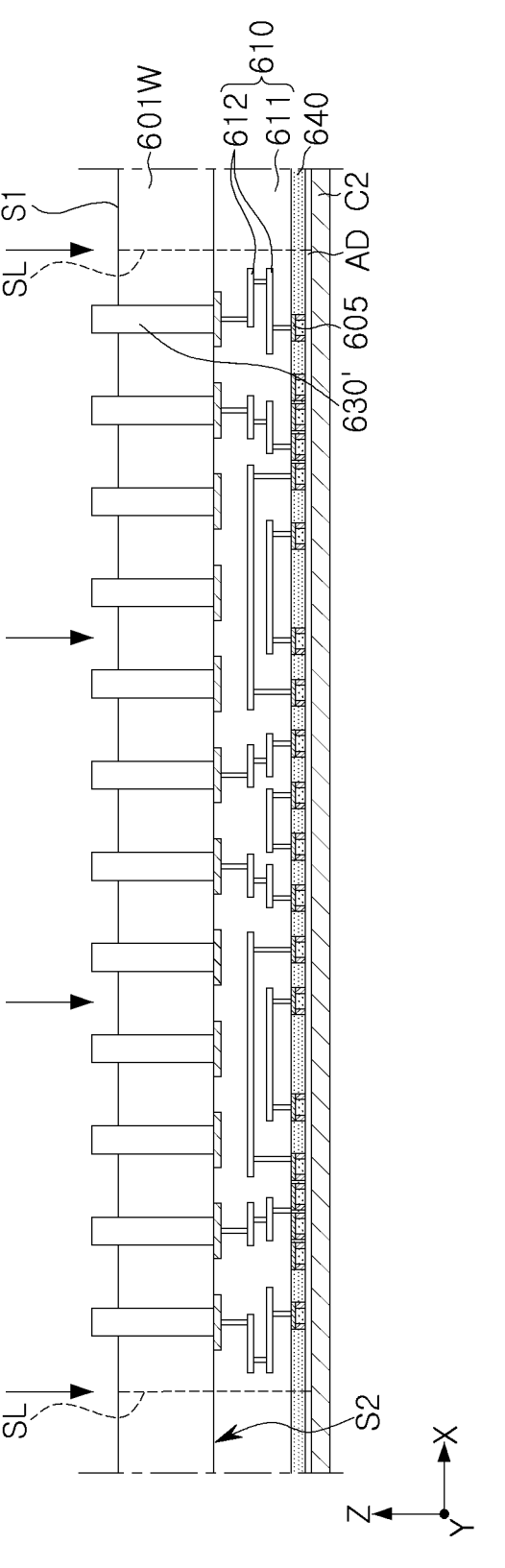

Referring to FIG. 19, a portion of the semiconductor substrate 601W may be removed to form a first surface S1 in which a portion of the through-electrode 630' is exposed. In an example, a portion of the semiconductor substrate 601W may be removed so that a portion of the through-electrode 630' protrudes from the first surface S1. Accordingly, the through-electrode 630' may have a shape that completely penetrates through the semiconductor substrate 601W. A portion of the semiconductor substrate 601W may be removed by a chemical mechanical polishing (CMP) process, an etch-back process, or a combination thereof.

Figure 20:
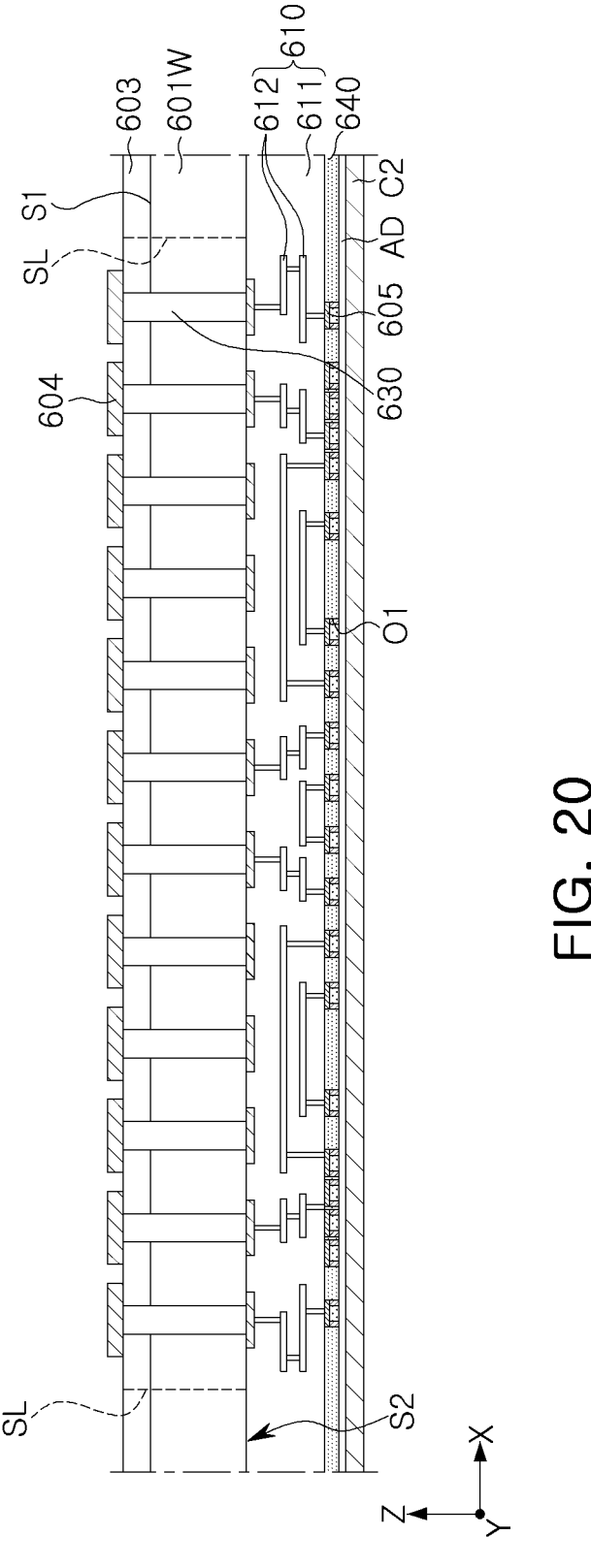

Referring to FIG. 20, a lower protective layer 603 and a lower pad 604 may be formed on the first surface S1 of the semiconductor substrate 601W The lower protective layer 603 may be formed by forming an insulating polymer film on the first surface S1 of the semiconductor substrate 601W and then removing a portion of the insulating polymer film to be exposed to the through-electrode 630. The lower pad 604 may be formed using a photolithography process, a plating process, or the like. The insulating polymer film may be formed by, for example, a spin coating process or a spraying process. The lower pad 604 may be formed to contact the through-electrode 630 exposed through the lower protective layer 603. In an example, the electrode pad 605 may be electrically connected to the through-electrode 630 through an interconnection layer and a contact via.

Figure 21:
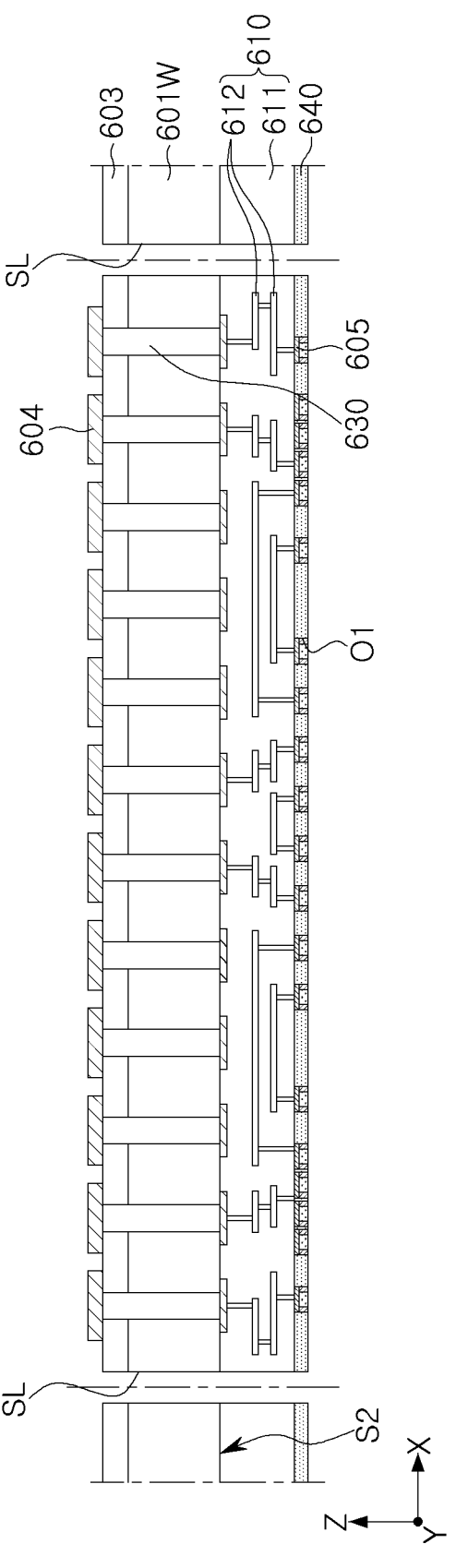

Referring to FIG. 21, the semiconductor substrate 601W of FIG. 20 may be cut along the scribe lane SL to separate the wafer-level substrates into a plurality of substrates.

According to example embodiments, by disposing a conductive support around the solder on the electrode pad, a semiconductor package having improved reliability and yield may be provided.

Various and beneficial advantages and effects are not limited to the above, and will be more easily understood in the course of describing specific example embodiments.

While example embodiments have been shown and described above, it will be apparent to those skilled in the art that modifications and variations could be made without departing from the scope of the appended claims.

What is claimed is:

1. A semiconductor package comprising:
a first structure comprising a first insulating layer and a connection pad which penetrates through the first insulating layer; and
a second structure comprising a second insulating layer bonded to the first insulating layer and a pad structure provided in a recess portion of the second insulating layer, wherein the pad structure is bonded to the connection pad and is wider than the connection pad,
wherein the pad structure comprises:
an electrode pad disposed in the recess portion, and on a bottom surface of the recess portion;
a solder disposed on the electrode pad and bonded to the connection pad; and
a conductive support disposed to surround a side surface of the solder, wherein the conductive support is on an upper surface of the electrode pad, and the conductive support is bonded to the first insulating layer,
wherein a melting point of the conductive support is higher than a melting point of the solder,
wherein the solder is provided between the connection pad and the electrode pad along a vertical direction perpendicular to the bottom surface of the recess portion,
wherein along a direction parallel to the bottom surface of the recess portion, a bottom surface of the solder that faces the electrode pad is wider than the connection pad, and
wherein an upper surface of the conductive support is in contact with the first insulating layer.

2. The semiconductor package of claim 1, wherein the conductive support comprises any one or any combination of aluminum (Al), copper (Cu), nickel (Ni), tungsten (W), platinum (Pt), and gold (Au).

3. The semiconductor package of claim 1, wherein the connection pad overlaps the solder along the vertical direction perpendicular to the first insulating layer,
wherein an upper surface of the solder is in contact with a portion of a lower surface of the first insulating layer and with a lower surface of the connection pad, and
wherein the lower surface of the first insulating layer and the lower surface of the connection pad form a common plane.

4. The semiconductor package of claim 1, wherein the second insulating layer comprises any one or any combination of a solder resist and a photosensitive resin.

5. The semiconductor package of claim 1, wherein the pad structure comprises a plurality of pad structures, each of which has a width of 13 μm to 23 μm, and are spaced apart from each other by an interval of 10 μm or less.

6. The semiconductor package of claim 1, wherein a lower surface of the conductive support is coplanar with the upper surface of the electrode pad,
wherein an upper surface of the conductive support is coplanar with an upper surface of the second insulating layer, and
wherein the lower surface of the conductive support is opposite the upper surface of the conductive support.

7. The semiconductor package of claim 1, wherein a lower surface of the conductive support is coplanar with the upper surface of the electrode pad,
wherein an upper surface of the solder is coplanar with an upper surface of the conductive support and an upper surface of the second insulating layer,
wherein the lower surface of the conductive support is opposite the upper surface of the conductive support, and
wherein the first insulating layer overlaps each of the solder, the conductive support and the second insulating layer along the vertical direction.

8. The semiconductor package of claim 1, wherein the electrode pad and the pad structure have similar widths.

9. The semiconductor package of claim 1, wherein the connection pad and the electrode pad are formed of similar materials.

10. The semiconductor package of claim 1, wherein the second structure is wider than the first structure.

11. The semiconductor package of claim 1, wherein the electrode pad covers the bottom surface of the recess portion.

12. The semiconductor package of claim 1, wherein the solder and the first insulating layer overlap along the vertical direction, and wherein along the direction parallel to the bottom surface of the recess portion, an upper surface of the solder is wider than the connection pad.

13. A semiconductor package comprising:

a first structure comprising a first insulating layer and a connection pad which penetrates through the first insulating layer; and a second structure comprising a second insulating layer bonded to the first insulating layer and a pad structure provided in a recess portion of the second insulating layer, wherein the pad structure is bonded to the connection pad and is wider than the connection pad, wherein the pad structure comprises:

an electrode pad disposed on a bottom surface of the recess portion;

a solder disposed on the electrode pad and bonded to the connection pad, wherein along a direction parallel to the bottom surface of the recess portion, a bottom surface of the solder that faces the electrode pad is wider than the connection pad; and a conductive support disposed to surround a side surface of the solder, wherein the conductive support is on an upper surface of the electrode pad, and the conductive support is bonded to the first insulating layer, wherein a melting point of the conductive support is higher than a melting point of the solder, wherein the solder is provided between the connection pad and the electrode pad along a vertical direction perpendicular to the bottom surface of the recess portion, wherein the electrode pad and the second insulating layer overlap along the direction parallel to the bottom surface of the recess portion, and wherein an upper surface of the conductive support is in contact with the first insulating layer.

14. The semiconductor package of claim 13, wherein the conductive support comprises any one or any combination of aluminum (Al), copper (Cu), nickel (Ni), tungsten (W), platinum (Pt), and gold (Au).

15. The semiconductor package of claim 13, wherein an upper surface of the solder is in contact with a portion of a lower surface of the first insulating layer and with a lower surface of the connection pad, and wherein the lower surface of the first insulating layer and the lower surface of the connection pad form a common plane.

16. The semiconductor package of claim 13, wherein the solder and the first insulating layer overlap along the vertical direction perpendicular to the bottom surface of the recess portion, wherein along the direction parallel to the bottom surface of the recess portion, an upper surface of the solder is wider than the connection pad.

17. The semiconductor package of claim 13, wherein the second insulating layer comprises any one or any combination of a solder resist and a photosensitive resin.

18. The semiconductor package of claim 13, wherein the electrode pad is between the conductive support and the bottom surface of the recess portion, and wherein the conductive support is directly on the upper surface of the electrode pad.

19. The semiconductor package of claim 13, wherein the electrode pad is in the recess portion.

20. The semiconductor package of claim 13, wherein the electrode pad covers the bottom surface of the recess portion.

* * * * *